(12) United States Patent
Bensahel et al.

(10) Patent No.: US 6,596,555 B2
(45) Date of Patent: Jul. 22, 2003

(54) FORMING OF QUANTUM DOTS

(75) Inventors: Daniel Bensahel, Grenoble (FR); Olivier Kermarrec, Gieres (FR); Yves Campidelli, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/921,642

(22) Filed: Aug. 3, 2001

(65) Prior Publication Data

US 2002/0039833 A1 Apr. 4, 2002

(30) Foreign Application Priority Data

Aug. 4, 2000 (FR) .............................. 00 10346

(51) Int. Cl.[7] .............................. H01L 21/20
(52) U.S. Cl. .................. 438/22; 438/478; 438/962
(58) Field of Search ............... 438/22, 46, 47, 438/478, 479, 433, 482, 488–507, 902, 909, 962; 117/89, 85, 87, 92, 93; 257/14, 19, 9

(56) References Cited

U.S. PATENT DOCUMENTS

| | | | | |
|---|---|---|---|---|
| 5,313,484 A | * | 5/1994 | Armito | 372/46 |
| 5,608,229 A | | 3/1997 | Mukai et al. | 257/14 |
| 5,783,498 A | * | 7/1998 | Dotta | 427/238 |
| 5,851,904 A | * | 12/1998 | Schwarz et al. | 438/482 |
| 5,888,885 A | * | 3/1999 | Xie | |
| 5,913,986 A | * | 6/1999 | Matsuyama | 136/255 |
| 6,103,600 A | * | 8/2000 | Ueda et al. | |
| 6,130,142 A | * | 10/2000 | Westwater | 438/478 |
| 6,268,041 B1 | * | 7/2001 | Goldstien | 428/208 |
| 6,297,095 B1 | * | 10/2001 | Muralidhar et al. | |
| 6,313,015 B1 | * | 11/2001 | Lee et al. | |
| 6,313,017 B1 | * | 11/2001 | Varhue | 438/503 |
| 6,326,311 B1 | * | 12/2001 | Ueda et al. | |
| 6,368,889 B1 | * | 4/2002 | Suemasu | 438/22 |
| 2002/0197831 A1 | * | 12/2002 | Todd et al. | |

OTHER PUBLICATIONS

Hernandez, C. et al., "Ge/Si Self–Assembled Quantum Dots Grown on Si(001) in an Industrial High–Pressure Chemical Vapor Deposition Reactor," *Journal of Applied Physics*, 86(2):1145–1148, Jul. 15, 1999.

Asahi, H., "Self–Organized Quantum Wires and Dots in III–V Semiconductors," *Advanced Materials*, No. 13, pp. 1019–1026, 1997.

* cited by examiner

*Primary Examiner*—Savitri Mulpuri
(74) *Attorney, Agent, or Firm*—Eisa K. Jorgenson; Robert Iannucci; Seed IP Law Goup PLLC

(57) ABSTRACT

A method of forming, on a single-crystal semiconductor substrate of a first material, quantum dots of a second material, including growing by vapor phase epitaxy the second material on the first material in optimal conditions adapted to ensuring a growth at a maximum controllable rate. In an initial step, a puff of a gas containing the second material is sent on the substrate, in conditions corresponding to a deposition rate much faster than the maximum controllable rate.

18 Claims, 2 Drawing Sheets

FORMING OF QUANTUM DOTS

TECHNICAL FIELD

The present invention relates to the manufacturing of "quantum dots" of a first material in a second semiconductor material. More specifically, the present invention relates to the forming of quantum dots in a silicon substrate.

BACKGROUND OF THE INVENTION

Such quantum dots are, for example, described in document "Ge/Si self-assembled quantum dots grown on Si (100) in an industrial high-pressure chemical vapor deposition reactor" by C. Hernandez, Y. Campidelli, D. Simon, D. Bensahel, I. Sagnes, G. Patriarche, P. Boucaus and S. Sauvage, published in J. Appl. Phys., 86/2, 1999, 1145–1148. They are used in a great number of fields of application. The telecommunication field is considered hereafter as a non-limiting example.

In the telecommunication field, systems based on optical fibers are increasingly used. For this purpose, transmitters adapted to converting a potential difference into a light signal and receivers adapted to converting a light signal transmitted by an optical fiber into an electric signal are used. The transmitted and/or received light signal is generally located in a wavelength range between 1.4 and 1.5 $\mu$m.

Up to a recent period, combinations of materials of columns III and V of the periodic table of elements have been used to form such receivers. For example, gallium arsenide (AsGa) or phosphorus indide (InP).

It would be however preferred to use silicon-based materials for optical transmitters and receivers, but the use of silicon poses different problems. First, the energy gap of silicon between its valence and conduction bands is relatively small and the transitions are of "indirect" type. "Indirect" means that the passing of an electron from the valence band to the conduction band occurs in several jumps and not in a single jump as in the case of III-V compounds. Silicon is then almost impossible to use as an emitter, that is, a converter of electric power into light power. Indeed, due to the indirect character of the electronic transitions, said transitions are highly dissipative and only slightly emissive. Further, the relatively small energy band gap, on the order of 1.1 eV, corresponds to an emission of photons having a wavelength smaller than 1 $\mu$m, seldom used in the field of telecommunications.

It has thus been provided to improve the optical properties, that is, the emission and reception properties, of silicon by forming quantum dots therein.

FIG. 1 illustrates in a partial simplified cross-section view a quantum dot such as described, for example, in the above-mentioned article of the Journal of Applied Physics. Dot B is formed of a germanium island formed on a single-crystal silicon substrate S. Although it is theoretically desired to form a perfect cube having an edge smaller than 50 nm, a dome- or drop-shaped nanostructure B having a base L and a height h is formed in practice. In practice, such dots with a base L ranging between 20 and 50 nm and a height ranging between 6 and 30 nm can be achieved. Dot B is encapsulated in a single-crystal silicon layer.

In many applications, to obtain acceptable performances, for example a transceiver with a satisfactory emissivity/receptivity, it is desirable to be able to form several superposed planes, each containing several dots similar to that in FIG. 1.

As discussed in the previously-mentioned article, the forming of domes or drops results from a mechanism of stress between crystal meshes having different, but relatively close dimensions, of two semiconductors. This so-called Stranski-Krastanow growth process has been shown to cause, for example, the forming of germanium drops on silicon based on various deposition processes including molecular epitaxies, low-pressure vapor phase chemical depositions, or vapor phase chemical depositions under strong vacuum.

More specifically, to form germanium quantum dots in silicon, an epitaxy by continuous injection of germane ($GeH_4$) on a single-crystal silicon substrate is for example performed. Then, the few first deposited atomic layers form a layer having a regular but non planar surface. Due to the stress associated with the crystal lattice differences, the surface has a "rippling" shape of sinusoidal type. In other words, the upper surface of a germanium layer of a few atomic layers, formed on silicon, has regularly distributed bumps and holes. As the injection of germane continues, the crystallographic stress—deformations of the natural germanium lattice—cause the growth of drops of dots similar to those in FIG. 1. This injection must be interrupted when the drops or dots have reached a desired dimension, before occurrence of a coalescence of the drops and the forming of a continuous layer containing dislocations.

An epitaxial growth of a silicon layer that encapsulates the germanium dots is then performed.

FIG. 2 illustrates, in a partial simplified cross-section view, the result of the repeated implementation of such a method. For example, three substantially horizontal planes of germanium drops (quantum dots) 21 encapsulated in silicon 22 have been formed on a silicon substrate 20.

FIG. 3 illustrates in a partial simplified top view one of the planes of drops 21.

It is desired to obtain dot densities as high as possible ($\geq 10^{10}$ cm$^{-2}$) and a size distribution as fixed as possible. However, as very schematically illustrated in FIGS. 2 and 3, the current implementation of the Stranski-Krastanow stress growth method results in heterogeneous drop structures as concerns the drop distribution as well as their size. To underline all the difficulties of implementation of this method, the main steps of the vapor phase epitaxy of germanium drops on a silicon substrate will be reminded.

First, the surface state of the silicon substrate has a significant role. It is currently believed that an optimal compromise between a perfect homogeneity and a certain distribution of defects has to be found.

The choice of the epitaxy conditions also appears to have to satisfy a compromise. Indeed, these conditions must be chosen so that the epitaxy is not too slow since, in this case, risks associated with the presence of inevitable impurities (brought in by the gas precursors and/or associated with the reactor leak rate) increase. However, if the germanium drop growth rate is too high, the process becomes difficult to control. Indeed, this growth must be precisely interrupted, as previously indicated.

Thus, an "optimal" temperature, which corresponds to a maximum "controllable" growth rate, that is, a rate as fast as possible to avoid the above-mentioned defects and sufficiently slow to enable interruption of the epitaxy in a precise manner at a given stage (for example, a few tens of monoatomic layers) is defined for given pressure, flow, and gas dilution conditions, in an epitaxy reactor of given type.

As an example, a typical sequence of implementation of a Stranski-Krastanow method at a temperature on the order of 650° C. (from 630 to 670° C.) and at a pressure ranging between 0.02 and 0.04.10$^5$ Pa (from 20 to 30 Torr) includes, starting from a single-crystal silicon substrate, the steps of:

injecting silane with a 10% dilution in hydrogen for substantially 5 s, which results in the growth of substantially from two to three single-crystal silicon monolayers (optional step);

injecting germane with a 10% dilution in hydrogen for substantially 30 s, which results in the growth of germanium "drops" of a height corresponding to a pile of some thirty atoms; and reinjecting silane to form an encapsulation layer.

According to this conventional sequence, the silane and germane injections are successively performed at close flow rates. Hydrogen (the carrier gas) is injected at a rate of approximately 10 l/mn. The flow rate of the injected gases is generally maintained between 15 and 25 cm$^3$/mn, typically on the order of 20 cm$^3$/mn. This flow rate is chosen as previously explained to obtain a maximum controllable deposition rate.

SUMMARY OF THE INVENTION

An embodiment of the present invention provides a method of quantum dot growth adapted to forming regular dots, homogeneously arranged on a substrate.

The method is reproducible and forms on a single-crystal semiconductor substrate of a first material, quantum dots of a second material. The method grows by vapor phase epitaxy the second material on the first material in optimal conditions adapted to ensuring a growth at a maximum controllable rate, and including an initial step consisting of sending on the substrate a puff of a gas containing the second material, in conditions corresponding to a deposition rate much faster than said maximum controllable rate.

According to an embodiment of the present invention, the first material forming the substrate is silicon and the second material forming the dots is germanium.

According to an embodiment of the present invention, the method is implemented in an epitaxy reactor at a temperature from 630 to 670° C. at a pressure from 0.02 to 0.04*10$^5$ Pa, said optimal conditions corresponding to a flow rate on the order of 15 to 25 cm$^3$/mn of germane with a 10% dilution in hydrogen, and the initial step consisting of sending a puff of germane with a 10% dilution in hydrogen at a flow rate on the order of 200 cm$^3$/mn for a duration ranging from 1 to 5 s.

According to an embodiment of the present invention, the initial step of sending of a puff is followed by an injection of germane in said optimal conditions for 25 to 40 s.

According to an embodiment of the present invention, the first material forming the substrate is silicon or germanium and the second material forming the dots is a rare earth.

According to an embodiment of the present invention, the first material forming the substrate is silicon oxide and the second material forming the dots is silicon nitride.

The foregoing objects, features and advantages of the present invention will be discussed in detail in the following non-limiting description of specific embodiments in connection with the accompanying drawings.

DETAILED DESCRIPTION OF THE INVENTION

For clarity, the same elements have been designated with the same references in the different drawings and, as usual in the representation of integrated circuits, the various drawings are not to scale.

Figure 1:
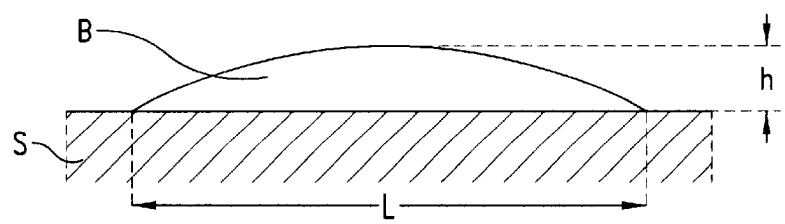
FIG. 1 illustrates, in a partial simplified cross-section view, a quantum dot.
Figure 2:
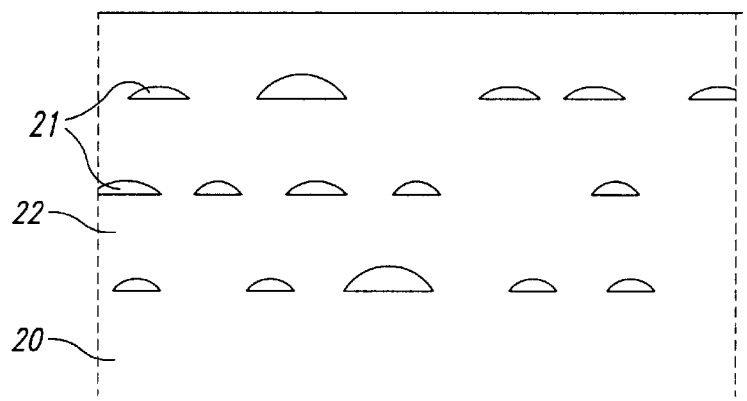
FIG. 2 illustrates, in a simplified partial cross-section view, the result of a conventional step of growth of several quantum dot planes.
Figure 3:
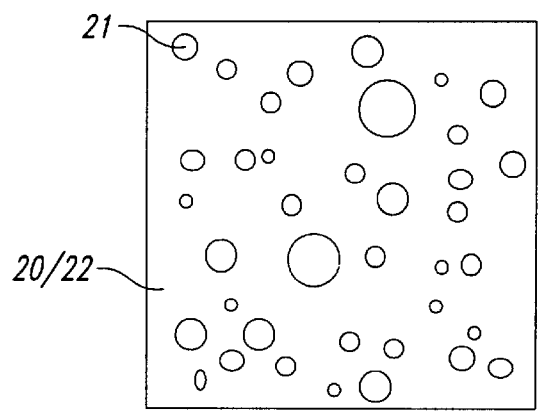
FIG. 3 illustrates in a partial simplified top view, one of the planes of the structure of FIG. 2.
Figure 4:
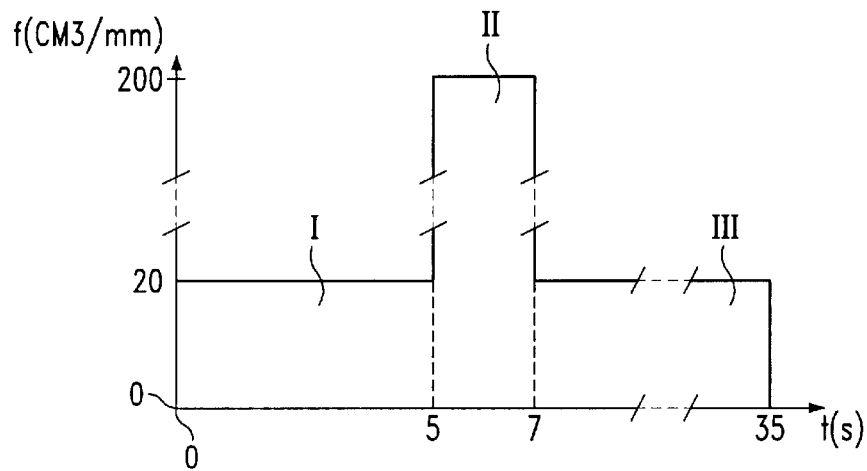
FIG. 4 illustrates flow rates of injected gases according to an embodiment of the present invention.

The method according to an embodiment of the present invention will be discussed hereafter in relation with FIG. 4, which illustrates the variation along time of flow rates of gases injected into an epitaxy reactor during the forming of quantum dots. The x-axis of the diagram represents injection duration t in seconds. The y-axis represents flow rate f in cm$^3$/mn.

As a non-limiting example, the temperature is considered to be maintained at a constant value between 600 and 700° C., for example, 635° C. Similarly, the pressure is considered to be maintained at a value between 0.025 and 0.040 * 10$^5$ Pa (from 20 to 30 Torr).

The method starts with initial steps of cleaning and preparing of the single-crystal silicon substrate surface. For example, a few monoatomic silicon layers are first grown by injection of silane. Silane with a 10% dilution in hydrogen is for example injected for substantially 5 s at a flow rate ranging between 15 and 25 cm$^3$/mn, for example, 20 cm$^3$/mn. This first step is illustrated by portion I, to the left of FIG. 4.

Then, an injection of a gas containing germanium, for example, germane, is performed to form the quantum dots. However, according to the present invention, this injection starts with the sending of a "puff" of germane. A puff means an injection of a large amount of germane for a short time. For example, germane diluted at 10% in hydrogen will be injected at a mean flow rate of about 200 cm$^3$/mn for a duration of about 2 s. This puff is illustrated by central portion II of FIG. 4, between times t=5 and 7 s. During this puff, the mean flow rate is much greater than the optimal flow rate, providing a maximum controllable deposition rate for the considered reactor.

Then, the injection of germane carries on at the optimal flow rate. The flow is brought down to a value ranging between 15 and 25 cm$^3$/mn, for example on the order of 20 cm$^3$/mn, for a duration from 25 to 30 s, for example, 28 s. The flow rate and the duration are adjusted to grow the some ten desired atomic layers of the germanium drops or quantum dots. This drop growth step is illustrated by portion III to the right of FIG. 4, between t=7 s and t=35 s.

Finally, a silicon encapsulation layer is grown, still in the same pressure, flow rate and temperature conditions. For example, silane diluted in hydrogen used as a carrier gas is injected at a flow rate on the order of 20 cm$^3$/mn. The duration of this last step is adjusted according to the pressure, flow rate, and temperature conditions, to grow an encapsulation layer of desired thickness.

The preceding sequence of successive steps of sending a germane puff, injecting germane at an "optimal" flow rate, and growing a silicon encapsulation layer, may then be repeated to form as many planes as necessary.

Figure 5:
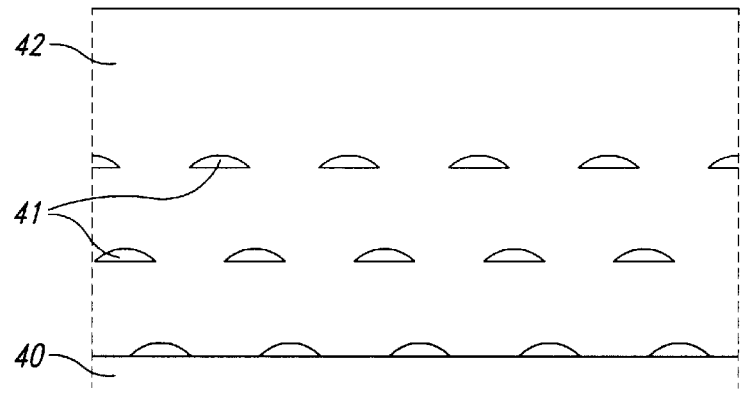
FIG. 5 illustrates in a simplified partial cross-section view the result of a method of growth of several quantum dot planes according to an embodiment of the present invention.

FIG. 5 illustrates, in a simplified partial cross-section view, the forming on a silicon substrate 40 of three successive planes of germanium drops 41 encapsulated in silicon 42, by the method according to the present invention.

Figure 6:
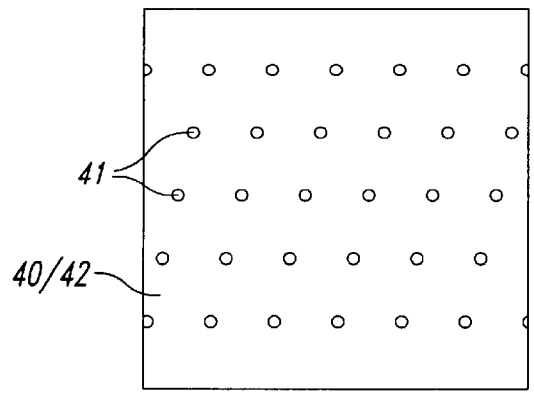
FIG. 6 illustrates, in a partial simplified top view, one of the planes of the structure of FIG. 5.

FIG. 6 illustrates in a simplified partial top view the state of a plane of drops 41 before encapsulation. The considered plane may be the first plane directly formed on substrate 40, or any higher plane formed on an encapsulation layer 42.

As illustrated in FIGS. 5 and 6, drops 41 formed by the method according to the present invention have homogeneous dimensions and a uniform distribution, on and inside silicon 40-42. This distribution is uniform in terms of spacing regularity between drops 42 on a given plane as well as in terms of identity of the density between two different planes.

This improvement has been experimentally acknowledged, without being theoretically explained. Without being a limitation of the present invention, it may be thought that the improvements thus observed are due to the very fast and significant expansion of the initial puff. Indeed, in less than five seconds, a large amount of gas containing germanium passes from the atmospheric pressure to the much lower pressure of the epitaxy chamber. It may be assumed that such an expansion causes a spraying effect that limits the germanium diffusion at the substrate surface. This spraying effect would then not leave time for the germanium atoms to diffuse and organize at the substrate surface to form a regular layer. However, it would cause a forced nucleation by a homogeneous "bonding" of the germanium on the substrate, the bonding points forming as many nucleation points in the subsequent regular growth. The reproducibility of the structure then depends on the reproducibility of the initial puff.

The present invention thus advantageously enables obtaining, based on a method of simple implementation and at relatively low temperature, germanium quantum dots distributed in a homogenous, regular and reproducible manner on at least one plane in silicon.

The advantages obtained in terms of applications are many. For example, in the telecommunication field, it is possible to thus form sufficiently sensitive devices, in an adequate wavelength field, to form transmitters. The devices obtained by means of a conventional method could conversely only be used as sensors. As compared to such conventional sensors, those obtained by means of the method according to the present invention have an improved sensitivity.

Of course, the present invention is likely to have various alterations, modifications, and improvements which will readily occur to those skilled in the art. In particular, the quantum dot dimensions, which are defined by the sole injection conditions and on which the operating wavelength of the general device depends, may be modified in any appropriate manner.

Further, the forming of germanium dots in silicon has been considered in the present description. However, the present invention also applies to other types of materials. It may for example be proceeded as described to form nucleation centers in the forming of a triple layer of silicon oxide—silicon nitride—silicon oxide type. More specifically, the method of the present invention would then enable, after conventional forming of a silicon oxide sub-layer, growing silicon nitride drops encapsulated in silicon oxide instead of a continuous intermediary layer. This type of structure would be useful in applications in which a variation of the dielectric constant is desired to be obtained or to limit the diffusion of dopants in the structure upon subsequent anneals, and would in particular apply to memories with a small number of electrons.

The method of the present invention also enables introducing quantum dots of rare earths such as erbium (Er) in substrates of silicon, germanium and/or strained or relaxed silicon-germanium alloys.

The present invention also applies to the forming of metallic nanostructures in insulating matrixes. This enables modifying the dielectric constant of the insulator.

Generally speaking, the present invention applies to the forming by vapor phase chemical deposition of quantum dots of any material in any substrate.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of forming, on a single-crystal semiconductor substrate of a first material, quantum dots of a second material, the method comprising:

growing by vapor phase epitaxy the second material on the first material in optimal conditions adapted to ensuring a growth at a maximum controllable rate, and including an initial step of sending on the substrate a quantity of a gas containing the second material at a mean flow rate that is much greater than an optimal flow rate at which the second material is sent on the substrate to insure the growth at the maximum controllable rate, the initial step of sending occurring in conditions corresponding to a deposition rate that is at least about eight times faster than said maximum controllable rate, thereby forming the quantum dots on the substrate.

2. The method of claim 1, wherein the first material forming the substrate is silicon and the second material forming the dots is germanium.

3. A method of forming, on a single-crystal semiconductor substrate of a first material, quantum dots of a second material, the method comprising:

growing by vapor phase epitaxy the second material on the first material in optimal conditions adapted to ensuring a growth at a maximum controllable rate, and including an initial step of sending on the substrate a quantity of a gas containing the second material, in conditions corresponding to a deposition rate faster than said maximum controllable rate, wherein the growing is implemented in an epitaxy reactor at a temperature from 630 to 670° C., at a pressure from 0.02 to 0.04*$10^5$ Pa, said optimal conditions corresponding to a flow rate on the order of 15 to 25 $cm^3$/mn of germane with a 10% dilution in hydrogen, and the quantity of the second material comprises a 10% dilution in hydrogen sent at a mean flow rate of about 200 $cm^3$/mn for a duration ranging from 1 to 5 s, thereby forming the quantum dots on the substrate.

4. The method of claim 3, wherein the sending a quantity is followed by an injection of germane in said optimal conditions for 25 to 40 s.

5. A method of forming, on a single-crystal semiconductor substrate of a first material, quantum dots of a second material, the method comprising:

growing by vapor phase epitaxy the second material on the first material in optimal conditions adapted to ensuring a growth at a maximum controllable rate, and including an initial step of sending on the substrate a quantity of a gas containing the second material at a mean flow rate that is much greater than an optimal flow rate at which the second material is sent on the substrate to insure the growth at the maximum controllable rate, the initial step of sending occurring in conditions corresponding to a deposition rate faster than said maximum controllable rate, wherein the first material forming the substrate is silicon or germanium and the second material forming the dots is a rare earth, thereby forming the quantum dots on the substrate.

6. A method of forming, on a single-crystal semiconductor substrate of a first material, quantum dots of a second material, the method comprising:

growing by vapor phase epitaxy the second material on flit first material in optimal conditions adapted to ensuring a growth at a maximum controllable rate, and including an initial step of sending on the substrate a quantity of a gas containing the second material at a mean flow rate that is much greater than an optimal flow rate at which the second material is sent on the substrate to insure the growth at the maximum controllable rate, the initial step of sending occurring in conditions corresponding to a deposition rate faster than said maximum controllable rate, wherein die first material forming the substrate is silicon oxide and the second material forming the dots is silicon nitride, thereby forming the quantum dots on the substrate.

7. A method of forming, on a single-crystal semiconductor substrate of a first material, quantum dots of a second material, the method comprising:

in an epitaxy reactor, determining a first range of flow rates of the second material to obtain a controllable deposition rate of the second material or the substrate of the first material at or below a maximum controllable deposition rate;

determining a first duration for injecting an initial quantity of the second material on the substrate;

determining an initial mean flow rate, above the maximum controllable deposition rate, for injecting the initial quantity of the second material on the substrate;

injecting the second material into the epitaxy reactor for the first duration at the initial mean flow rate; and subsequently injecting the second material into the epitaxy reactor for a second duration, longer than the first duration, at a mean flow rate in the first range of flow rates, thereby forming the quantum dots on the substrate.

8. The method of claim 7, wherein the first material forming the substrate is one of silicon and germanium and the second material forming the quantum dots is a rare earth.

9. The method of claim 7, wherein the first material forming the substrate is silicon oxide and the second material forming the quantum dots is silicon nitride.

10. The method of claim 7, wherein the first material forming the substrate is silicon and the second material forming the quantum dots is germanium.

11. The method of claim 10, wherein:

the epitaxy reactor is operated at a temperature from 630 to 670° C. and a pressure from 0.02 to $0.4*10^5$ Pa;

the second material is provided as germane diluted at 10% in hydrogen;

the first range of flow rates is 15 to 25 $cm^3$/mn of germane;

the initial mean flow rate of the second material during the first duration is about 200 $cm^3$/mn; and the first duration is a duration ranging from 1 to 5 s.

12. The method of claim 11, wherein the second duration of injecting the second material into the epitaxy reactor at a mean flow rate in the first range of flow rates is in the range of 25 to 40 s.

13. A method for forming quantum dots in a substrate, the method comprising:

cleaning and preparing a surface of a single-crystal silicon substrate;

installing the substrate into an epitaxy reactor;

injecting a quantity of a gas containing germanium into the epitaxy reactor;

continuing injecting the gas containing germanium into the epitaxy reactor at an optimal flow rate, wherein injecting a quantity of a gas comprises injecting the gas at a mean flow rate that is much greater than the optimal flow rate; and growing a silicon encapsulation layer, wherein injecting the gas at an optimal flow rate comprises injecting the gas at an optimal flow rate that provides a maximum controllable deposition rate for the epitaxy reactor, thereby forming the quantum dots on the substrate.

14. The method of claim 13, wherein the gas containing germanium comprises germane diluted at 10% in hydrogen.

15. The method of claim 14, wherein injecting a quantity of a gas comprises injecting the gas at a mean flow rate of approximately 200 $cm^3$/mn for a duration of approximately 2 s.

16. The method of claim 15, wherein continuing injecting the gas into the epitaxy reactor at an optimal flow rate comprises continuing injecting the gas into the epitaxy reactor at a flow rate ranging between 15 and 25 $cm^3$/mn for a duration from 25 to 30 s.

17. The method of claim 16, wherein the temperature of the epitaxy reactor is maintained at a constant value between 600 and 700° C.

18. The method of claim 17, wherein the pressure of the epitaxy reactor is maintained at a value between 0.025 and $0.040*10^5$ Pa.

* * * * *

UNITED STATES PATENT AND TRADEMARK OFFICE
CERTIFICATE OF CORRECTION

PATENT NO.   : 6,596,555 B2
DATED        : July 22, 2003
INVENTOR(S)  : Daniel Bensahel et al.

It is certified that error appears in the above-identified patent and that said Letters Patent is hereby corrected as shown below:

<u>Title page,</u>
Item [56], OTHER PUBLICATIONS, insert: -- Wang et al., "Self-Limiting Effects of Flow Rate Modulation Epitaxy of GaAs on Patterned Substrate, Journal of Crystal Growth 195 (1998) pp 586-590. --.

<u>Column 7,</u>
Lines 24-25, "on flit first material" should read as -- on the first material --.
Lines 34-35, "wherein die first material" should read as -- wherein the first material --.
Lines 43, "second material or the substrate" should read as -- second material on the substrate --.

<u>Column 8,</u>
Line 12, "from 0.02 to 0.4 * $10^5$Pa" should read as -- from 0.02 to 0.04 * $10^5$Pa --.

Signed and Sealed this

Eleventh Day of November, 2003

JAMES E. ROGAN
*Director of the United States Patent and Trademark Office*